United States Patent
Navarro Paredes et al.

(10) Patent No.: US 11,289,367 B2
(45) Date of Patent: Mar. 29, 2022

(54) METHOD, ATOMIC FORCE MICROSCOPY SYSTEM AND COMPUTER PROGRAM PRODUCT

(71) Applicant: Nederlandse Organisatie voor toegepast-natuurwetenschappelijk onderzoek TNO, 's-Gravenhage (NL)

(72) Inventors: Violeta Navarro Paredes, 's-Gravenhage (NL); Abbas Mohtashami, 's-Gravenhage (NL); Hamed Sadeghian Marnani, Nootdorp (NL)

(73) Assignee: Nederlandse Organisatie voor toegepast-natuurwetenschappelijk onderzoek TNO, 's-Gravenhage (NL)

( * ) Notice: Subject to any disclaimer, the term of this patent is extended or adjusted under 35 U.S.C. 154(b) by 172 days.

(21) Appl. No.: 16/626,152

(22) PCT Filed: Jun. 28, 2018

(86) PCT No.: PCT/NL2018/050418
§ 371 (c)(1),
(2) Date: Dec. 23, 2019

(87) PCT Pub. No.: WO2019/004829
PCT Pub. Date: Jan. 3, 2019

(65) Prior Publication Data
US 2020/0227311 A1  Jul. 16, 2020

(30) Foreign Application Priority Data

Jun. 29, 2017 (EP) .................................. 17178633

(51) Int. Cl.
*G01N 29/06* (2006.01)
*G01Q 60/38* (2010.01)
(Continued)

(52) U.S. Cl.
CPC ... *H01L 21/76805* (2013.01); *G01N 29/0681* (2013.01); *G01Q 60/38* (2013.01);
(Continued)

(58) Field of Classification Search
CPC .............. H01L 21/76805; H01L 22/20; G01N 29/0681; G01N 29/069; G01N 2291/2697;
(Continued)

(56) References Cited

U.S. PATENT DOCUMENTS 5,831,739 A    11/1998 Ota
6,704,089 B2   3/2004 van der Schaar et al.
(Continued)

OTHER PUBLICATIONS

Garcia, et al. "Advanced scanning probe lithography," *Nature Nanotechnology*, vol. 9, pp. 577-587 (Aug. 5, 2014).
(Continued)

*Primary Examiner* — Nicole M Ippolito
(74) *Attorney, Agent, or Firm* — Leydig, Voit & Mayer, Ltd.

(57) ABSTRACT

This document is directed at a method of manufacturing a semiconductor element, the method comprising manipulating a surface of a substrate using an atomic force microscope, the atomic force microscope including a probe, the probe including a cantilever and a probe tip, the substrate including at least one or more device features embedded underneath the surface. The method comprises: imaging the embedded device features, and identifying that a position of the probe tip of the atomic force microscope is aligned with the feature; and displacing the probe tip transverse to the surface for exerting a stress for performing the step of surface manipulation, as for example contact holes. Imaging is performed by applying and obtaining an acoustic signal to and from the substrate via the probe tip, including a first and a second signal component at different frequencies. The
(Continued)

imaging and surface manipulation are performed using said same probe and probe tip.

22 Claims, 6 Drawing Sheets

(51) Int. Cl.
    *G01Q 70/12*     (2010.01)
    *G01Q 70/14*     (2010.01)
    *G01Q 70/00*     (2010.01)
    *H01L 21/768*     (2006.01)
    *G01Q 80/00*     (2010.01)
    *H01L 21/66*     (2006.01)

(52) U.S. Cl.
    CPC ............ *G01Q 70/12* (2013.01); *G01Q 70/14* (2013.01); *G01Q 80/00* (2013.01); *H01L 22/20* (2013.01); *G01N 29/069* (2013.01); *G01N 2291/2697* (2013.01)

(58) Field of Classification Search
    CPC ........ G01Q 60/38; G01Q 70/12; G01Q 70/14; G01Q 80/00
    USPC ............. 850/1, 2, 3, 4, 5, 6, 7, 8, 33, 40, 42
    See application file for complete search history.

(56) References Cited

U.S. PATENT DOCUMENTS

| | | | |
|---|---|---|---|
| 7,397,596 | B2 | 7/2008 | Yacoubian |
| 8,302,480 | B2 | 11/2012 | Maris et al. |
| 8,322,220 | B2 | 12/2012 | Prater et al. |
| 8,961,853 | B2 | 2/2015 | Mirkin et al. |
| 2006/0037401 | A1 | 2/2006 | Shekhawat et al. |
| 2008/0276695 | A1 | 11/2008 | Prater |
| 2010/0159229 | A1 | 6/2010 | Shin et al. |
| 2011/0107473 | A1 | 5/2011 | Carpick et al. |
| 2013/0077066 | A1 | 3/2013 | Inanami |
| 2020/0057028 | A1* | 2/2020 | Piras ...................... G01N 29/38 |

OTHER PUBLICATIONS

Hu, et al. "Imaging of subsurface structures using atomic force acoustic microscopy at GHz frequencies," *Journal of Applied Physics*, vol. 109, pp. 084324-084324-6 (Apr. 21, 2011).

Jiang, et al. "Nanopatterning on silicon surface using atomic force microscopy with diamond-like carbon (DLC)-coated Si probe," *Nanoscale Research Letters*, vol. 6(1), pp. 1-7 (Sep. 2, 2011).

Kolosov, et al. "Seeing the invisible-ultrasonic force microscopy for true subsurface elastic imaging of semiconductor nanostructures with nanoscale resolution," *NSTI-Nanotech*, vol. 1. pp. 24-26 (2012).

Kwak, et al. "Visualization of interior structures with nanoscale resolution using ultrasonic-atomic force microscopy," Proc. SPIE 8691, vol. 8691, pp. 869117-1-869117-9 (Apr. 9, 2013).

Shedd, et al. "The scanning tunneling microscope as a tool for nanofabrication," *Nanotechnology*, vol. 1, pp. 67-80 (Mar. 22, 1990).

Shekhawat, et al. "Nanoscale Imaging of Buried Structures via Scanning Near-Field Ultrasound Holography," *Science*, vol. 310, pp. 89-92 (Oct. 7, 2005).

Stan, et al., "Intermittent contact resonance atomic force microscopy," *Nanotechnology*, vol. 25, 8 pps (May 23, 2014).

Tetard, et al. "Imaging nanoparticles in cells by nanomechanical holography," *Nature Technology*, vol. 3, pp. 501-505 (Jun. 22, 2008).

Tetard, et al. "New modes for subsurface atomic force," *Nanotechnology*, vol. 5, pp. 105-109 (Dec. 10, 2009).

Yamanaka, et al. "Analysis of subsurface imaging and effect of contact elasticity," *Japanese Journal of Applied Physics*, vol. 33, pp. 3197-3203 (May 1994).

European Patent Office, International Search Report in corresponding International Application No. PCT/NL2018/050418, dated Oct. 5, 2018 (2 pages).

* cited by examiner

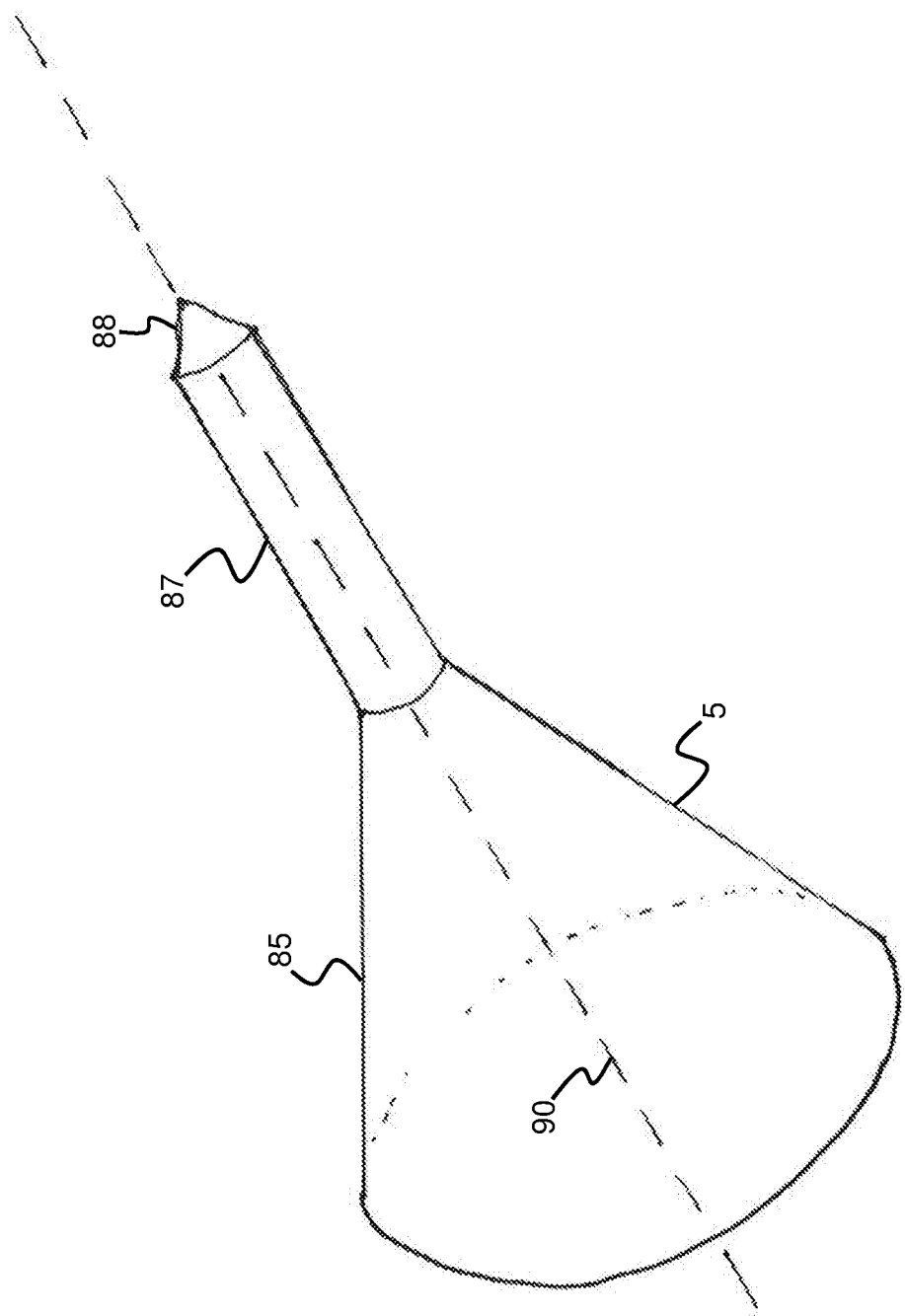

METHOD, ATOMIC FORCE MICROSCOPY SYSTEM AND COMPUTER PROGRAM PRODUCT

CROSS-REFERENCE TO RELATED APPLICATIONS

This patent application is a U.S. National Phase of PCT International Application No. PCT/NL2018/050418, filed Jun. 28, 2018, which claims priority to European Application No. 17178633.8, filed Jun. 29, 2017, which are both expressly incorporated by reference in their entireties, including any references contained therein.

FIELD OF THE INVENTION

The present invention is directed at a method of manufacturing a semiconductor element, the method comprising manipulating a surface of a substrate using an atomic force microscope, the atomic force microscope including a probe, the probe including a cantilever and a probe tip, the substrate including at least one or more device features embedded underneath the surface
The invention is further directed at an atomic force microscopy system configured for performing subsurface imaging of one or more embedded device features in a substrate underneath a substrate surface, and further configured for manipulating the substrate surface, wherein the atomic force microscopy system comprises a probe with a cantilever and at least one probe tip, and a sensor for sensing a position of the probe tip for detecting probe tip motion. Furthermore, the invention is directed at a computer program product.

BACKGROUND

In semiconductor industry, overlay and alignment of the patterning process across multiple successively applied layers is critical. Any error could easily result in poorly functioning or defective products. As given by Moore's law, in the present days circuitry is becoming increasingly smaller, down to nanometric size. Therefore, given the ever decreasing size of semiconductor elements and the correspondingly decreasing size of features, preventing errors becomes equally more challenging. For example, it is technically very challenging to manufacture contact holes of nanometer size for devices at the precise locations where they are required, aligned with the buried electrical contacts (gate, drain, . . . ) of a device being manufactured.

Existing methods use optical techniques (e.g. gratings) to perform overlay and alignment measurement and control. The current extreme ultraviolet (EUV) resists, however, are based on metals which are opaque to light. Therefore, these existing optical methods do not work.

Alternatively, other methods exist that allow subsurface detection of structures and that may not suffer from the above disadvantages with optical methods. For example an atomic force microscope may be applied to perform subsurface measurements, e.g. as is described in US patent application U.S. Pat. No. 6,392,229. However, such methods typically may only perform imaging or require multiple passes to perform both imaging and manipulation. This will be at the cost of both accuracy and speediness of the process. This is disadvantageous in an industrial high throughput environment.

SUMMARY OF THE INVENTION

It is an object of the present invention to provide a method of performing overlay and alignment control effectively, with sufficient accuracy for the smallest features, and suitable to be applied in an industrial high throughput environment.

To this end, there is provided herewith a method of manufacturing a semiconductor element, the method comprising manipulating a surface of a substrate using an atomic force microscope, the atomic force microscope including a probe, the probe including a cantilever and a probe tip, the substrate including at least one or more device features embedded underneath the surface, wherein the method comprises: imaging at least one of the embedded device features using the atomic force microscope, and identifying that a position of the probe tip of the atomic force microscope is aligned with the at least one embedded feature; and displacing the probe tip, using a probe actuator, at least in a direction transverse to the surface for exerting a stress on the surface that exceeds a yield stress of a material of the surface, for performing the step of surface manipulation; wherein the step of imaging is performed by applying an acoustic input signal to at least one of the probe or the substrate, and obtaining an acoustic return signal from the substrate via the probe tip, wherein the acoustic input signal comprises at least a first signal component at a first frequency and a second signal component at a second frequency; and wherein the probe tip is configured for performing said imaging and said step of surface manipulation, and wherein said steps of imaging and surface manipulation are performed using said same probe and probe tip.

In the present invention, the steps of imaging and surface manipulation are performed using said same probe and probe tip. The probe tip used in the method of the present invention is configured for obtaining the acoustic return signal from the substrate, while also being configured for performing surface manipulations. For example, the probe tip may be suitable shaped for performing certain manipulations, while also providing sufficient coupling with the sample surface to allow the receipt of a strong enough acoustic return signal. In this manner, the subsurface acoustic measurements may be performed while simultaneously performing the desired surface manipulations. This enables direct feedback on the alignment of the probe with the locations where the manipulations are performed, which thereby greatly enhances the accuracy of carrying out such manipulations in the correct location. Moreover, the method can be performed in one pass, which thereby enhances the throughput considerably, rendering the method suitable for industrial application.

For example, in an embodiment of the invention, the step of surface manipulation includes forming one or more contact holes in the substrate using the probe tip. The probe may be made suitable for enabling the creation of such contact holes, e.g. by providing a sharp tip suitable for hole manufacturing. During such forming of contact holes, the acoustic return signal is received via the probe tip due to coupling with the material of the sample. This provides the information on the subsurface structure, enabling imaging thereof.

In accordance with some embodiments the probe tip has a tip diameter smaller than 10 nanometer, preferably smaller than 6 nanometer, more preferable smaller than 5 nanometer or wherein the probe tip is shaped including a stylus type tip end for providing a high aspect ratio, and wherein a maximum depth of the contact holes formed using the probe tip corresponds with a length of the stylus type tip end. In particular, for performing service manipulations such as drilling, a tip diameter in the range provided above is sharp enough to perform these manipulations. Where in accordance with some embodiments the probe tip is shaped including a stylus type tip end in order to provide a high aspect ratio, the contact holes to be formed by manipulation can be made sufficiently deep to reach deeper layers of the sample material. In fact, this provides a drill type probe tip. At the same time, the contact area between the probe tip and the sample material is relatively large when forming such contact holes. This provides a suitable coupling to receive the acoustic return signal.

In accordance with yet a further embodiment, for performing the step of imaging the first signal component comprises a frequency below 250 megahertz and the second signal component either includes a frequency below 2.5 megahertz or a frequency such as to provide a difference frequency of at most 2.5 megahertz with the first signal component, such as to enable analysis of an induced stress field in the substrate or wherein for performing the step of imaging the first signal component comprising a first frequency above 500 megahertz and the second signal component includes a second frequency above 500 megahertz, wherein a difference between the first frequency and the second frequency is at most 5 megahertz, such as to provide the return signal including a third signal component having a frequency corresponding with the difference frequency, for providing the return signal to include a scattered fraction of the acoustic input signal scattered from the embedded device features.

In the above embodiments, the lower frequency ranges may be applied in order to perform subsurface imaging by acoustic ultrasound force microscopy methods based on variations in the elasticity of the material as a result of subsurface structures. Using the high end of the frequency range provided above, the elasticity of the material no longer plays an important role, and the information from the subsurface features is obtained by scattering of the acoustic waves against such structures or layers. As may be appreciated, in the above example using a high frequency above 500 megahertz, a heterodyne method is applied wherein two signals of almost the same frequency are mixed, such as to yield a signal component at the differential frequency between the two main signals. For example applying a signal of 500 megahertz in combination with a signal of 502 megahertz, provides a signal component having a frequency of 2 megahertz, the difference between both input signals. This additional signal component conveys the information from the subsurface structures and may be analyzed to perform imaging.

In accordance with yet another embodiment, the method further comprises a step of controlling, using a controller, a displacement of the probe tip in at least the direction transverse to the surface for controlling the force exerted on the surface to be selectively above or below the yield stress of the material of the surface, such as to selectively perform said step of surface manipulation. By performing this manner of controlling the stress of the probe tip exerted on the surface above or below the yield stress, it becomes possible to selectively perform surface manipulations or lead to surface impact. In that case, it becomes possible to selectively perform imaging, manipulation, or both at the same time at a certain location.

In accordance with yet another of these embodiments, the method further comprises the step of receiving, by the controller, data indicative of one or more of a group comprising: material parameters of a material of the probe tip, material parameters of a material of the substrate material, and an elastic constant of the cantilever and using the received data to control the step of manipulation by controlling the probe actuator, such as to control at least one of a lateral diameter or a depth of the contact holes.

The data received by the controller in the above mentioned embodiments enables to tune the lateral size and depth of the holes manufactured using the probe tip. For example, the elastic properties of the material being indented by the probe tip may be monitored. By observing the shape of the force versus the displacement curves, when the probe tip reaches materials of different elastic properties, the slope of these curves (rigidity) changes. This can be used to control the depth of the holes. Therefore, in accordance with another embodiment the method further comprises analyzing, using an analyzer, the return signal during the step of manipulating for obtaining information on the exerted force and the displacement of the probe tip, calculating from the force and displacement information, an elasticity of the material of the substrate that is being manipulated via the probe tip and detecting a change of material by monitoring the calculated elasticity.

In accordance with yet another embodiment, the material of the probe tip has a hardness of at least 1000 MPa. Alternatively or additionally, in accordance with some embodiments, the probe tip is formed of or is coated with a material including at least one element of a group comprising: a carbon based crystal material, such as diamond or a material including diamond, or a carbon or diamond dust coating or outer layer; silicon oxide ($SiO_2$), or silicon carbide (SiC). Examples of hardness values of various suitable materials are as follows: diamond: 7000 MPa; SiC: 2400 MPa; Si: 1150 MPa. As may be appreciated, the invention is not limited to the use of these materials or coatings for providing the probe tip, and the method may be applied using different types of probe tips being fabricated from a different material or coated with a different type of coating.

In a second aspect of the invention there is provided an atomic force microscopy system configured for performing subsurface imaging of one or more embedded device features in a substrate underneath a substrate surface, and further configured for manipulating the substrate surface, wherein the atomic force microscopy system comprises a probe with a cantilever and at least one probe tip, and a sensor for sensing a position of the probe tip for detecting probe tip motion, the system further comprising: an actuator stage for positioning the probe tip relative to the substrate for establishing contact between the probe tip and the substrate surface; a probe actuator for displacing the probe tip at least in a direction transverse to the surface for exerting a force on the surface that exceeds a yield stress of a material of the surface, for performing a step of manipulating of the substrate surface; one or more signal application actuators for applying an acoustic input signal to at least one of the substrate or the probe, wherein the acoustic input signal comprises at least a first signal component at a first frequency and a second signal component at a second frequency; wherein the sensor is configured for detecting an return signal from the substrate in response to applying the acoustic input signal; wherein the system further comprises an analyzer configured for analyzing the return signal for obtaining information on the embedded device features for enabling imaging thereof and wherein the probe tip is configured both for said manipulating of the substrate surface and for receiving the return signal from the substrate, such as to enable said subsurface imaging and said surface manipulation to be performed using said same probe tip.

In a third aspect of the present invention there is provided a computer program product on a computer readable medium comprising a computer executable code comprising instructions for causing a processor or controller to perform a method in accordance with the first aspect, when executed on an atomic force microscopy system in accordance with the second aspect above.

BRIEF DESCRIPTION OF THE DRAWINGS

The invention will further be elucidated by description of some specific embodiments thereof, making reference to the attached drawings. The detailed description provides examples of possible implementations of the invention, but is not to be regarded as describing the only embodiments falling under the scope. The scope of the invention is defined in the claims, and the description is to be regarded as illustrative without being restrictive on the invention. In the drawings:

FIG. 4 illustrates an exemplary probe tip that may be used with the present invention.

DETAILED DESCRIPTION

Figure 1:
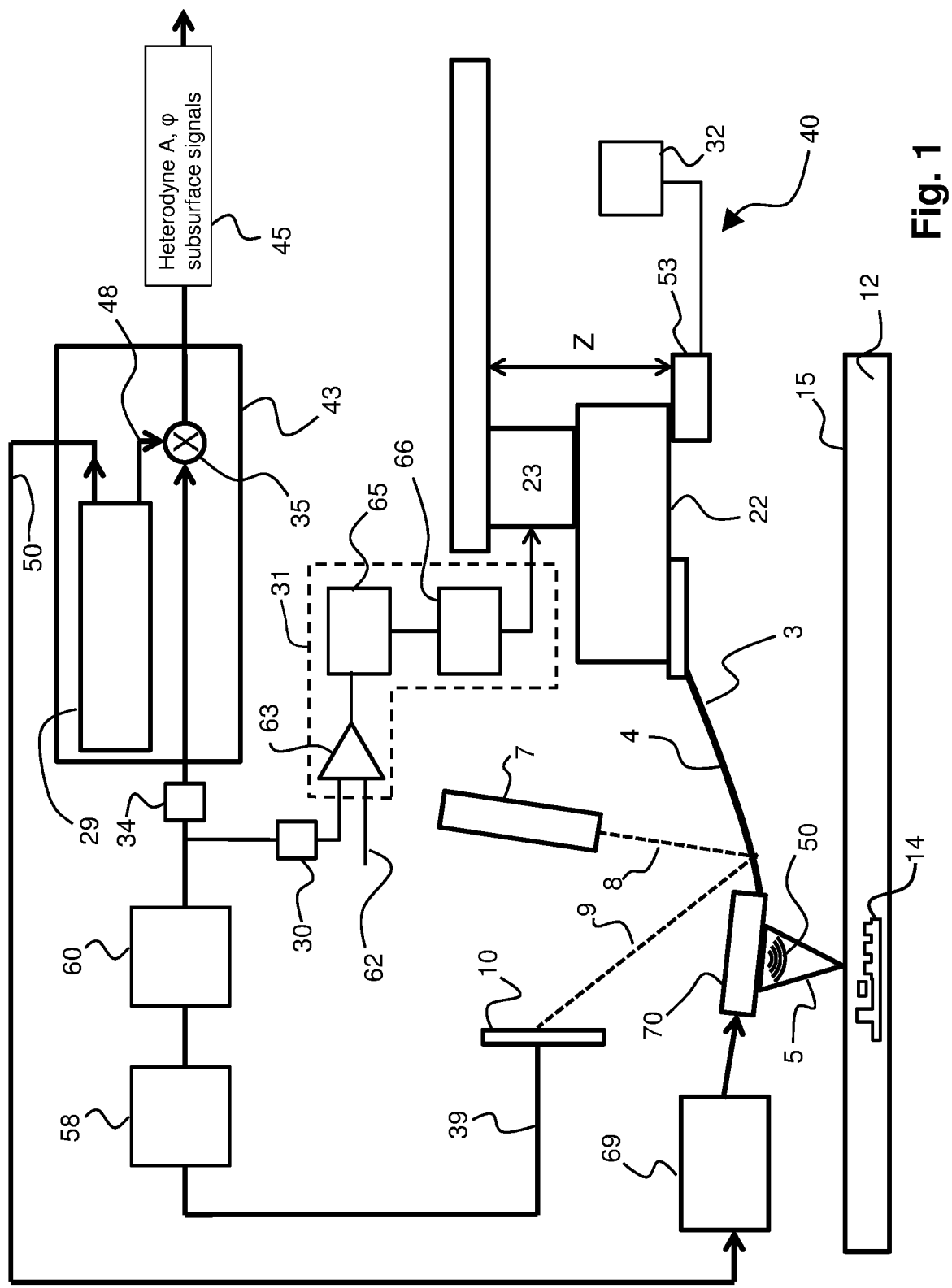
FIG. 1 schematically illustrates an atomic force microscopy system.
Figure 2:
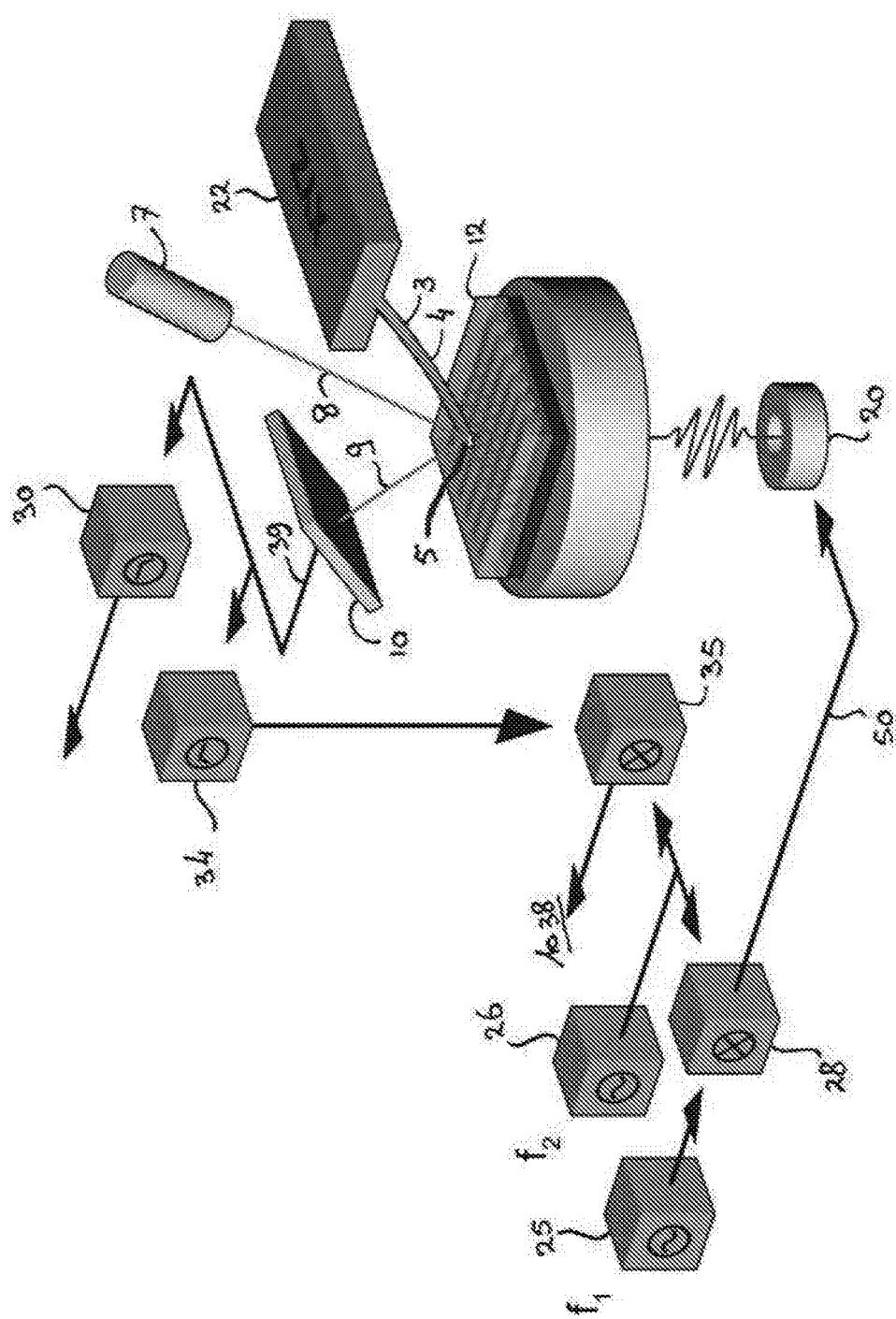
FIG. 2 schematically illustrates an atomic force microscopy system.

FIG. 1 schematically illustrates an atomic force microscopy system (AFM) 1, suitable for use in a method of the present invention and in accordance with an embodiment of the present invention. Another embodiment of a system 1 in accordance with the invention (similar to the system of FIG. 1) is illustrated in FIG. 2, reciting corresponding reference numerals. The system 1 comprises a probe 3 having a cantilever 4 and a probe tip 5. The probe tip 5 is brought in contact with a surface 15 of a sample 12 comprising a semi-manufactured semiconductor element 14. A light source 7, typically a laser, provides an optical signal beam 8 that is incident on the back of the probe tip 5. A reflected optical beam 9 is received by an optical sensor 10. Any vibration of the probe tip 5 perpendicular to the surface 15 of the sample 12 will result in a deflection of the reflected optical beam 9. This deflection can be accurately determined by means of optical sensor 10 which provides an (electrical) output signal 39 for further analysis.

The method of the present invention applies, in addition to performing surface manipulations, an acoustic vibration signal via the probe tip 5 to the sample 12, which enables the detection of sub-surface features e.g. of the semi-manufactured semiconductor element 14. These vibrations may be sensed again by the probe tip 5 with great accuracy and decomposition of the input and output signals may effectively be achieved via lockin amplifier 43. In the system 1 of FIG. 1, the acoustic vibration signal may be applied using a transducer 70 mounted on or in connection with the probe tip 5 or probe 3. This allows an acoustic signal produced by the transducer 70 to penetrate sample 12 via the probe tip 5, e.g. in as in the set-up illustrated in FIG. 1. In respect of this, it is noted that it is not essential to the invention to apply the acoustic signal via the probe tip 5. The transducer 70 for applying the acoustic vibration signal may be located elsewhere relative to the sample 12, enabling the acoustic vibration signal to be applied from any desired direction (e.g. above, below, from aside, or even through another part or entity). Alternatively, for example, the acoustic vibration signal may be applied from the back side of the sample 12. In the embodiment illustrated in FIG. 2, instead of the transducer 70 on the probe 3, a transducer 20 is mounted underneath the sample 12 for applying the acoustic signals.

The sample 12 in FIG. 1 consists of a substrate layer 13, and one or more optional device layers such as layer 17. The semiconductor element 14 in FIG. 1 is a semi-manufactured semiconductor element, thus it is being manufactured and may or may not receive additional layers later on. As may be appreciated, the sample 12 illustrated in FIG. 1 (and also the samples illustrated in other figures throughout this document) are merely examples. Features of earlier layers may be buried underneath the surface 15. The manufacturing process may require certain surface manipulations to be carried out at the surface 15. For example, it may be necessary to manufacture contact holes in the sample 12 such as to reach features of deeper layers, for example in order to provide electrical connections (e.g. to connect an electrode or another features). As may be appreciated, such contact holes are to be created in the exact correct spot above the feature of semiconductor element 14, to enable making a low resistance connection (or making an electrical connection at all).

Dependent on the frequency of the acoustic signals applied, acoustic detection methods operate on the basis of either variations in the elasticity of the surface (low frequency, e.g. up to 250 megahertz) or scattering (very high frequency, 500 megahertz and above e.g. up to 10 gigahertz). At frequencies over 500 megahertz, the principles of scattering govern, and sub-surface features are detected based on the acoustic signal return to the probe tip 5 via scattering at the features. The acoustic vibration signal 50 provided by transducer 70, after penetrating the sample 12, is scattered by subsurface features, producing acoustic vibrations at the surface 15. These are sensed by the probe tip 5. By scanning the probe 3 relative to the surface 15, such that the probe tip 5 follows a path on the surface 15 of the sample 12, the sub-surface topography of the sample 12 becomes measurable and may be used to manipulate the surface 15 at the exact location where this is desired.

There are various possibilities for obtaining this information. Primarily, by leading the output signal 39 through low-pass filter 30, the low frequency components of the output signal 39 may be provided to a feedback control system 31. This system 31 uses a proportional-integral-differential (PID) feedback controller 65 and amplifier 66 to control an AFM Z-piezo unit 23 to maintain the probe tip 5 at its setpoint force in feedback mode. This signal contains the desired information for performing surface topography mapping of the surface 15, and hence create an image of the surface 15 of monolayer 14. From the image or from the mapping data, defects such as missing molecules of the monolayer pinholes) can be detected. This same information may alternatively or additionally also be obtained by including an additional Z-level sensor 53 that directly determines the Z-distance of the probe head 22 with respect to a fixed point (e.g. on the metrology frame). Hence, it is not essential to obtain the surface topography measurements from the first fraction of the output signal 39, including the low frequency components of the signal 39.

The acoustic vibration signal 50 to be provided via the transducer 70 on the probe 3 to the sample 12 consists of a high frequency component $f_1$ and a low frequency component $f_2$, and is created as follows. One or more signal generators 29 comprise at least first frequency generator 25, a second frequency generator 26, and a signal mixer 28. A high frequency input signal component $f_1$ 25 and a low frequency input signal component $f_2$ 26 are mixed by mixer 28 and provided to the transducer 70. The transducer 70, via the probe tip 5, sends the acoustic vibration signal into the material of the sample 12. The sensor signal from optical sensor 10 is provided to a low-pass filter 30 for contact mode feedback, and the output of the low-pass filter 30 is sent to the feedback control system 31. The low pass filter has a cutoff frequency of, for example, around 2 kHz. This is fast enough with respect to the scanning speed, but only slightly higher than the sampling rate (e.g. 1024 pixels in 1 second corresponds to a sampling rate of 1.024 kHz). Feedback control system 31 uses the feedback signal to maintain the AFM system fixed at its setpoint force. The output signal 39 from the optical sensor 10 is further provided to a high-pass filter 34. The high pass filter 34 also has a cutoff frequency of, for example, around 2 kHz, thus thereby transmitting the second fraction of the output signal 39 including the high frequency ultrasound signal (i.e. including component $f_1$) and the low frequency modulation signal (i.e. including component $f_2$) to the demodulator 35. The demodulator 35 further receives the low frequency input signal $f_2$ 26 as a reference signal from the signal generator 29. An output signal of the demodulator 35 is provided to analysis system 38 which allows to analyze the location dependent ultrasound output signal to obtain the subsurface measurement information on the contact stiffness, for enabling binding strength analysis. Frequency generators 25 and 26, mixer 28, demodulator 35, and optionally analysis system 38 may form an integral system 43. In FIG. 1, further below, the frequency generators 25 and 26, the mixer 28, and the demodulator 35 are all part of a lockin amplifier 43.

In accordance with the invention, the imaging steps described extensively above, are performed in one go with any surface manipulation steps. This is possible for example due to the application of a probe 3 having a specially suitable probe tip 5. For example, for drilling contact holes, the probe tip may comprise a very sharp and elongated probe tip.

Figure 3A:
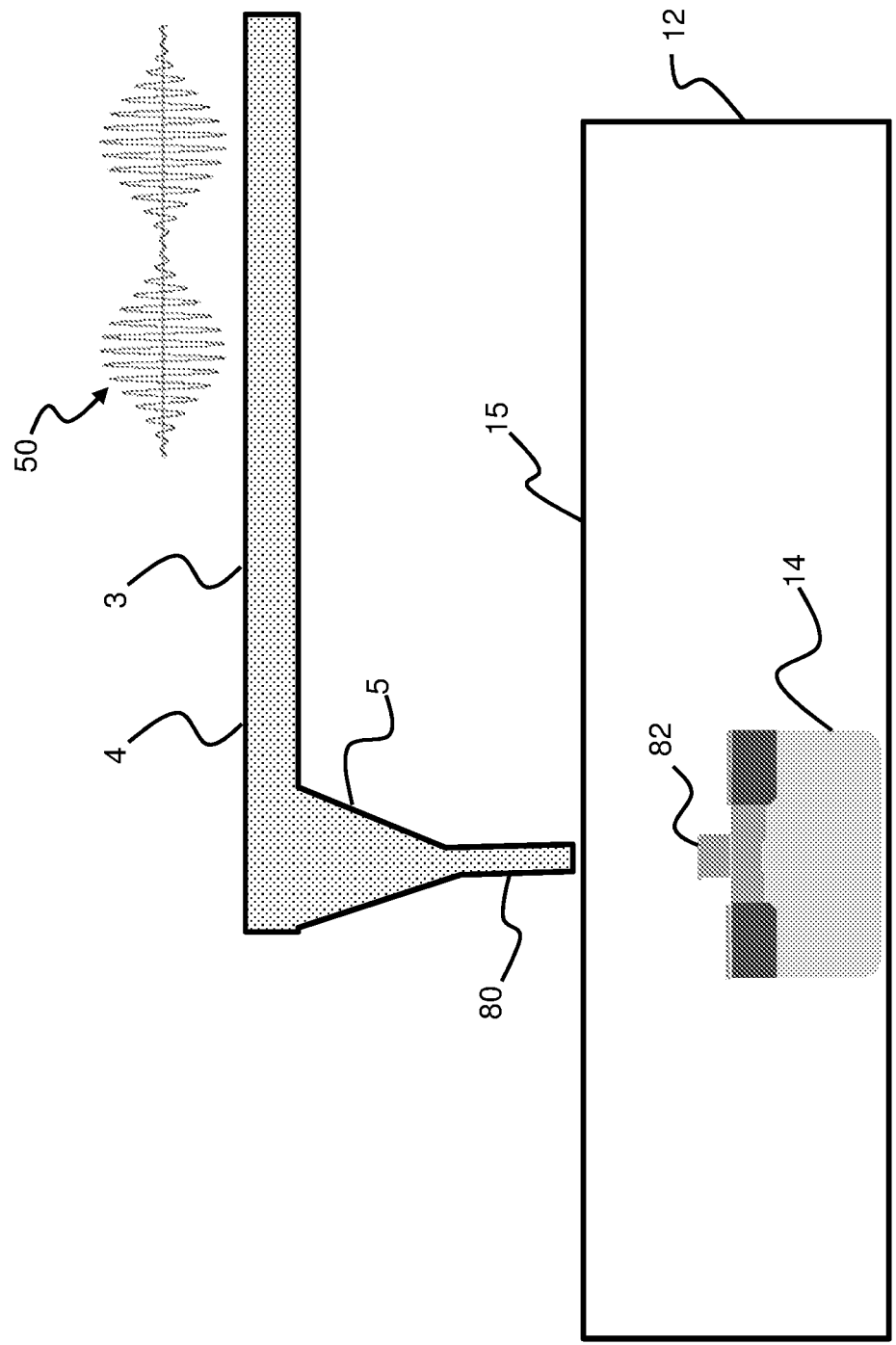
FIGS. 3A to 3C schematically illustrate how a method of the present invention may be performed.
Figure 3B:
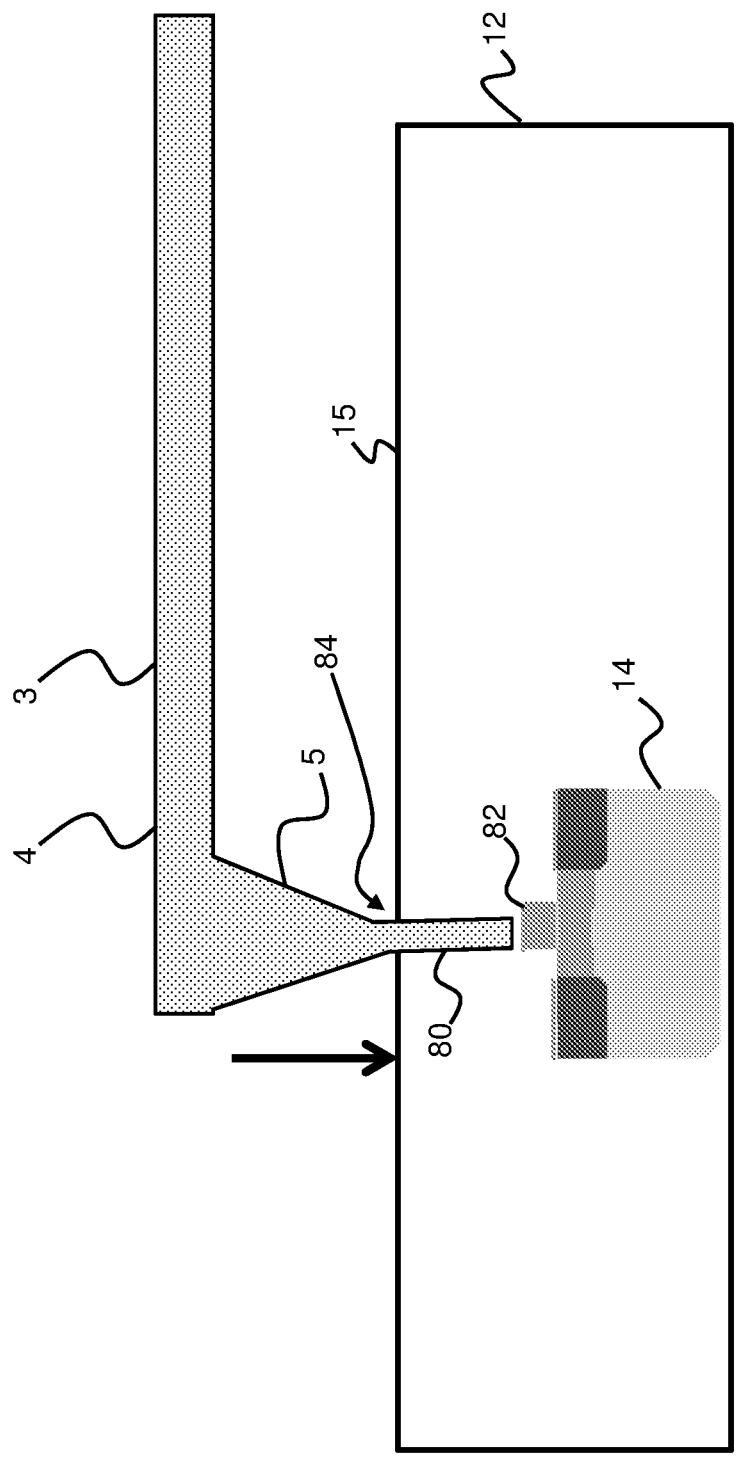
Figure 3C:
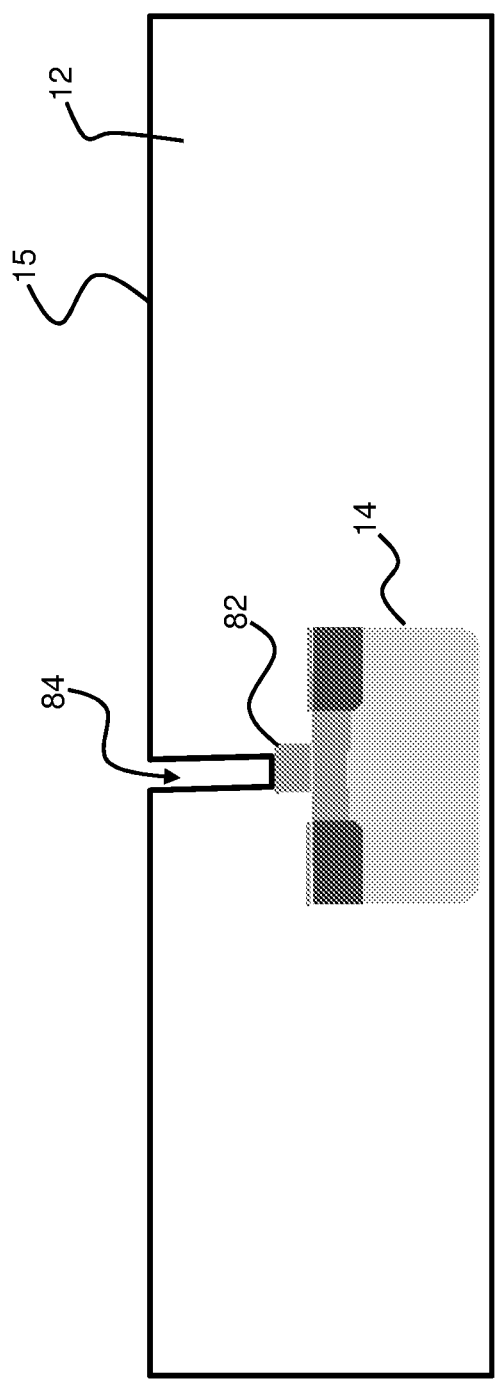

FIGS. 3A to 3C schematically illustrate a method in accordance with the invention. The method comprises, in a first step illustrated in FIG. 3A, a step of imaging, for example to reveal the embedded device features of semiconductor device 14 embedded in sample 12. The method uses an atomic force microscope of which in FIG. 3A only the probe 3 is illustrated. The step of imaging is performed by applying an acoustic input signal 50 to the probe 3, and obtaining an acoustic return signal from the substrate 12 via the probe tip 5. As explained, the acoustic input signal 50 comprises at least a first signal component at a first frequency and a second signal component at a second frequency. The probe 3 consists of the probe tip 5 and cantilever 4. An acoustic signal 50 is provided via the probe tip 5 into the sample 12 in the manner described for example above in relation to FIGS. 1 and 2. Depending on the frequency range of the acoustic signal 50, subsurface imaging is performed via the principles of scattering of the acoustic signal 50 against features of device 14, or via the sensing of differences in elasticity of the surface 15 due to the presence of subsurface features of device 14. The probe tip 5 comprises an elongated sharp tip 80 that will be used later for surface manipulations. During imaging, the position of the probe tip 5 is established and from the images it is evaluated whether the probe tip 5 is aligned with a desired embedded feature of the semiconductor device 14. For example, in FIG. 3A it is evaluated whether the sharp tip 80 is properly aligned with the connection element or electrode 82 of the device 14.

If the probe tip 5, and in particular the part thereof that performs the surface manipulations i.e. here in FIG. 3A the elongated sharp tip 80 (but this depends on the type of probe tip of course), the next step is performed. This is the step of performing the desired surface manipulations of the surface 15 of sample 12. This is illustrated in FIG. 3B. In this case a contact hole 84 is to be manufactured into the sample 12 to reach the electrode 82. To this end, the probe tip 5 is displaced using a probe actuator in a direction transverse to the surface 15 for exerting a stress on the surface 15 that exceeds a yield stress of the material of the sample 12. This enables to manufacture the contact hole 84, such as to perform the step of surface manipulation. During drilling, the vertical signal received by the photodiode of the AFM system from the probe tip 5 is monitored for enabling to detect a material change. For example, this may be achieved by analyzing, using an analyzer, the return signal during the step of manipulating for obtaining information on the exerted force and the displacement of the probe tip 5. From the data, an elasticity of the material of the substrate 12 that is being manipulated via the probe tip 5 may be calculated, and a change of material may be detected by monitoring the calculated elasticity.

The invention enables to perform the steps of imaging and surface manipulation using the same probe 3 and probe tip 5. This enables to perform the method in one pass across the surface, which considerably reduces the processing time. In an industrial application, wherein high throughput is desired at the best possible accuracy, this is advantageous. FIG. 3C illustrates the created contact hole 84 after the method is completed. Due to the fact that a change in material may be detected accurately by monitoring the exerted force and the displacement, the depth of the contact hole 84 can be controlled accurately such as to reach the electrode 82 of the device 14.

An embodiment of a probe tip 5 as illustrated in FIGS. 3A to 3C is schematically illustrated in FIG. 4. The probe tip 5 illustrated is axially symmetric around virtual longitudinal axis 90. The probe tip 5 comprises a cone portion 85, which is extended with an elongated part or elongated sharp tip 87. The end point of the tip 87 is already very sharp and may be sharp enough to manufacture the contact holes. However, for larger holes, or alternatively, the elongated part 87 may optionally comprise a sharp cone shaped end point 88. As may be appreciated, many different types of probes may be applied with different probe tips that are suitable for performing various kinds of surface manipulations. The illustrated probe tip 5 is suitable for creating holes in the surface 15, but the invention is not limited to the application of this probe tip.

The present invention has been described in terms of some specific embodiments thereof. It will be appreciated that the embodiments shown in the drawings and described herein are intended for illustrated purposes only and are not by any manner or means intended to be restrictive on the invention. It is believed that the operation and construction of the present invention will be apparent from the foregoing description and drawings appended thereto. It will be clear to the skilled person that the invention is not limited to any embodiment herein described and that modifications are possible which should be considered within the scope of the appended claims. Also kinematic inversions are considered inherently disclosed and to be within the scope of the invention. Moreover, any of the components and elements of the various embodiments disclosed may be combined or may be incorporated in other embodiments where considered necessary, desired or preferred, without departing from the scope of the invention as defined in the claims.

In the claims, any reference signs shall not be construed as limiting the claim. The term 'comprising' and 'including' when used in this description or the appended claims should not be construed in an exclusive or exhaustive sense but rather in an inclusive sense. Thus the expression 'comprising' as used herein does not exclude the presence of other elements or steps in addition to those listed in any claim. Furthermore, the words 'a' and 'an' shall not be construed as limited to 'only one', but instead are used to mean 'at least one', and do not exclude a plurality. Features that are not specifically or explicitly described or claimed may be additionally included in the structure of the invention within its scope. Expressions such as: "means for . . . " should be read as: "component configured for . . . " or "member constructed to . . . " and should be construed to include equivalents for the structures disclosed. The use of expressions like: "critical", "preferred", "especially preferred" etc. is not intended to limit the invention. Additions, deletions, and modifications within the purview of the skilled person may generally be made without departing from the spirit and scope of the invention, as is determined by the claims. The invention may be practiced otherwise then as specifically described herein, and is only limited by the appended claims.

The invention claimed is:

1. A method of manufacturing a semiconductor element, the method comprising manipulating a substrate surface of a substrate using an atomic force microscope, the atomic force microscope including a probe, the probe including a cantilever and a probe tip, the substrate including at least one or more device features embedded underneath the substrate surface, wherein the method comprises:
   imaging at least one of the embedded device features using the atomic force microscope, and identifying that a position of the probe tip of the atomic force microscope is aligned with the at least one embedded feature; and
   displacing the probe tip, using a probe actuator, at least in a direction transverse to the substrate surface, the displacing exerting a stress on the substrate surface that exceeds a yield stress of a material of the substrate surface, for performing a surface manipulation;
   wherein the imaging is performed by applying an acoustic input signal to at least one of the probe or the substrate, and obtaining an acoustic return signal from the substrate via the probe tip, wherein the acoustic input signal comprises at least a first signal component at a first frequency and a second signal component at a second frequency; and
   wherein the probe tip is configured for performing said imaging and said surface manipulation, and wherein the imaging and the surface manipulation are performed using said same probe and probe tip.

2. The method according to claim 1, wherein the surface manipulation includes forming one or more contact holes in the substrate using the probe tip.

3. The method according to claim 2, wherein the probe tip has a tip diameter smaller than 10 nanometer.

4. The method according to claim 1, wherein for performing the imaging the first signal component comprises a frequency below 250 megahertz and the second signal component either includes a frequency below 2.5 megahertz or a frequency so as to provide a difference frequency of at most 2.5 megahertz with the first signal component, so as to enable analysis of an induced stress field in the substrate.

5. The method according to claim 1, further comprising a controlling, using a controller, a displacement of the probe tip in at least the direction transverse to the substrate surface for controlling the force exerted on the substrate surface to be selectively above or below the yield stress of the material of the substrate surface, so as to selectively perform said surface manipulation.

6. The method according to claim 5 and wherein the surface manipulation includes forming one or more contact holes in the substrate using the probe tip, further comprising:
   receiving, by the controller, data indicative of one or more of the group consisting of: material parameters of a material of the probe tip, material parameters of a material of the substrate material, and an elastic constant of the cantilever; and
   using the received data to control the manipulation by controlling the probe actuator, so as to control at least one of a lateral diameter or a depth of the contact holes.

7. The method according to claim 1, further comprising analyzing, using an analyzer, the return signal during the manipulating for obtaining information on the exerted force and the displacement of the probe tip;
   calculating from the force and displacement information, an elasticity of the material of the substrate that is being manipulated via the probe tip; and
   detecting a change of material by monitoring the calculated elasticity.

8. The method according to claim 1, wherein:
   the material of the probe tip has a hardness of at least 1000 MPa; or
   the probe tip is formed of or is coated with a material including at least one element of the group consisting of: a carbon based crystal material or a carbon or diamond dust coating or outer layer; a silicon oxide ($SiO_2$), and a silicon carbide (SiC).

9. An atomic force microscopy system configured for performing a subsurface imaging of one or more embedded device features in a substrate underneath a substrate surface, and further configured for manipulating the substrate surface,
   wherein the atomic force microscopy system comprises a probe with a cantilever and at least one probe tip, and a sensor for sensing a position of the probe tip for detecting probe tip motion, the system further comprising:
   an actuator stage for positioning the probe tip relative to the substrate for establishing contact between the probe tip and the substrate surface;
   a probe actuator for displacing the probe tip at least in a direction transverse to the substrate surface, displacing exerting a force on the surface that exceeds a yield stress of a material of the substrate surface, for performing a manipulating of the substrate surface;
   one or more signal application actuators for applying an acoustic input signal to at least one of the substrate or the probe, wherein the acoustic input signal comprises at least a first signal component at a first frequency and a second signal component at a second frequency;
   wherein the sensor is configured for detecting a return signal from the substrate in response to applying the acoustic input signal;
   wherein the system further comprises an analyzer configured for analyzing the return signal for obtaining information on the embedded device features for enabling imaging thereof; and
   wherein the probe tip is configured both for said manipulating of the substrate surface and for receiving the return signal from the substrate, so as to enable said imaging and said surface manipulation to be performed using said same probe tip.

10. The atomic force microscopy system according to claim 9, wherein the probe tip is configured for forming one or more contact holes in the substrate during said manipulation, and wherein the probe tip has a tip diameter smaller than 10 nanometer.

11. The atomic force microscopy system according to claim 9, wherein the one or more signal application actuators are configured for applying the acoustic input signal such that the first signal component comprises a frequency below 250 megahertz and the second signal component either includes a frequency below 2.5 megahertz or a frequency so as to provide a difference frequency of at most 2.5 megahertz with the first signal component, so as to enable analysis of an induced stress field in the substrate.

12. The atomic force microscopy system according to claim 9, the system further comprising a controller for controlling a displacement of the probe tip in at least the direction transverse to the substrate surface for controlling the force exerted on the substrate surface to be selectively above or below the yield stress of the material of the substrate surface, so as to selectively perform said surface manipulation.

13. An atomic force microscopy system according to claim 9, wherein the material of the probe tip has a hardness of at least 1000 MPa; or wherein the probe tip is formed of or is coated with a material including at least one element of a group comprising: a carbon based crystal material, such as diamond or a material including diamond.

14. A non-transitory computer readable medium comprising a computer executable code comprising instructions for causing a processor or controller to perform a method of manufacturing a semiconductor element, the method comprising manipulating a substrate surface of a substrate using an atomic force microscope, the atomic force microscope including a probe, the probe including a cantilever and a probe tip, the substrate including at least one or more device features embedded underneath the substrate surface, wherein the method comprises:

imaging at least one of the embedded device features using the atomic force microscope, and identifying that a position of the probe tip of the atomic force microscope is aligned with the at least one embedded feature; and displacing the probe tip, using a probe actuator, at least in a direction transverse to the substrate surface, the displacing exerting a stress on the substrate surface that exceeds a yield stress of a material of the substrate surface, for performing a surface manipulation;

wherein the imaging is performed by applying an acoustic input signal to at least one of the probe or the substrate, and obtaining an acoustic return signal from the substrate via the probe tip, wherein the acoustic input signal comprises at least a first signal component at a first frequency and a second signal component at a second frequency; and wherein the probe tip is configured for performing said imaging and said surface manipulation, and wherein the imaging and the surface manipulation are performed using said same probe and probe tip on an atomic force microscopy system.

15. The atomic force microscopy system according to claim 9, wherein the probe tip is shaped including a stylus type tip end for providing a high aspect ratio, and wherein a maximum depth of the contact holes formed using the probe tip corresponds with a length of the stylus type tip end.

16. The atomic force microscopy system according to claim 9, wherein the one or more signal application actuators are configured for applying the acoustic input signal such that the first signal component comprising a first frequency above 500 megahertz and the second signal component includes a second frequency above 500 megahertz, wherein a difference between the first frequency and the second frequency is at most 5 megahertz, so as to provide the return signal including a third signal component having a frequency corresponding with the difference frequency, for providing the return signal to include a scattered fraction of the acoustic input signal scattered from the embedded device features.

17. The method according to claim 2, wherein the probe tip is shaped including a stylus type tip end for providing a high aspect ratio, and wherein a maximum depth of the contact holes formed using the probe tip corresponds with a length of the stylus type tip end.

18. The method of claim 1, wherein for performing the imaging, the first signal component comprises a first frequency above 500 megahertz and the second signal component includes a second frequency above 500 megahertz, wherein a difference between the first frequency and the second frequency is at most 5 megahertz, so as to provide the return signal including a third signal component having a frequency corresponding with the difference frequency, for providing the return signal to include a scattered fraction of the acoustic input signal scattered from the embedded device features.

19. The method according to claim 2, wherein the probe tip has a tip diameter smaller than 6 nanometer.

20. The method according to claim 2, wherein the probe tip has a tip diameter smaller than 5 nanometer.

21. The atomic force microscopy system according to claim 9, wherein the probe tip has a tip diameter smaller than 6 nanometer.

22. The atomic force microscopy system according to claim 9, wherein the probe tip has a tip diameter smaller than 5 nanometer.

* * * * *